United States Patent [19]

Yoshimoto et al.

[11] Patent Number: 5,293,064
[45] Date of Patent: Mar. 8, 1994

[54] LEAD FRAME AND METHOD OF MANUFACTURING A SEMICONDUCTOR DEVICE

[75] Inventors: Masanori Yoshimoto; Kazuto Tsuji; Masao Sakuma, all of Kawasaki; Kouichi Takeshita, Satsuma, all of Japan

[73] Assignees: Fujitsu Limited, Kawasaki; Kyushu Fujitsu Electronics Limited, Satsuma, both of Japan

[21] Appl. No.: 829,221

[22] Filed: Feb. 3, 1992

[30] Foreign Application Priority Data

Feb. 7, 1991 [JP] Japan ................... 3-016361

[51] Int. Cl.⁵ .................................. H01L 23/50
[52] U.S. Cl. .................................. 257/666; 257/670; 257/669; 257/671; 257/787
[58] Field of Search .................. 357/70, 72, 74

[56] References Cited

FOREIGN PATENT DOCUMENTS 1-175250 7/1989 Japan .
1-214148 8/1989 Japan .

Primary Examiner—Eugene R. LaRoche
Assistant Examiner—Viet Q. Nguyen
Attorney, Agent, or Firm—Staas & Halsey

[57] ABSTRACT

A lead frame for manufacturing a semiconductor device has at least one set of substantially parallel leads having inner ends for connection to a semiconductor chip, outer ends for external connection and central portions therebetween and an outer tiebar interconnecting the outer ends and having an elongated guide hole therein, the longer dimension of the guide hole being parallel to the leads. A lead bending die has a locating pin respectively corresponding to and received in sliding engagement in each guide hole. The die maintains a center portion of them lead frame in a first plane and, with each locating pin remaining in sliding engagement within the respective, elongated guide hole, bends the central portions of the leads thereby to dispose the respective outer ends of the leads in a second plane, displaced from the first plane. The outer tiebar and the sliding engagement of the locating pin in the guide hole serve to prevent undesirable deformation of the leads as a result of the bending operation. The central surface portion of the die further includes a recess for receiving at least a part of a package which seals a semiconductor chip therewithin. The lead frame may include plural sets of substantially parallel leads with corresponding outer tiebars and associated guide holes extending from respective, plural edges of the package.

16 Claims, 5 Drawing Sheets

PRIOR ART

LEAD FRAME AND METHOD OF MANUFACTURING A SEMICONDUCTOR DEVICE

BACKGROUND OF THE INVENTION

1. Field of the Invention

The present invention relates to a lead frame having a plurality of leads, a semiconductor device made by the use of said lead frame, a lead bending die for bending the leads of the lead frame, and a method of manufacturing a semiconductor device.

2. Description of the Related Art

Many semiconductor devices have been manufactured by mounting a semiconductor chip to a lead frame, bonding the semiconductor chip to the leads of the lead frame, and then forming a package by sealing the semiconductor chip with plastic molding or the like. There are several types of semiconductor devices, classified by the arrangement of the leads (pins). Semiconductor devices are often used with leads bent substantially perpendicular to a plane of the semiconductor chip, and for this purpose, the manufacturing process includes the step of bending the leads after packaging.

Recently, electronic equipment tends to be constructed with increased packaging density, and thus it is required that individual semiconductor devices be small in size or the number of leads per semiconductor device be increased. This requires that the width of each lead and the gap between adjacent leads be narrowed. However, a problem arises if the width and the gap are narrowed, in that troubles such as undesirable deformation occurs in the leads, for example, during the bending of the leads. Accordingly, it is desired to solve this problem.

Leads of lead frames are often made by etching, thereby the width of the lead and the gap between adjacent leads are narrowed. Also, leads of lead frames are sometimes made during a punching step.

Figure 7A:
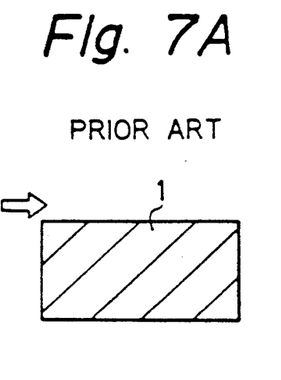
FIGS. 7A to 7C are cross-sectional views of leads.
Figure 7B:
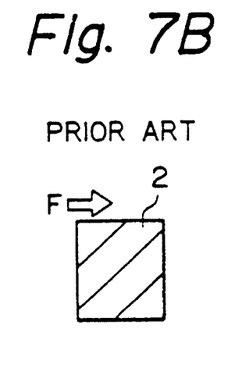
Figure 7C:
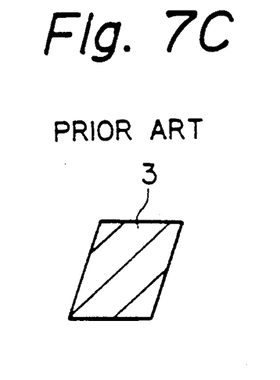
Figure 8:
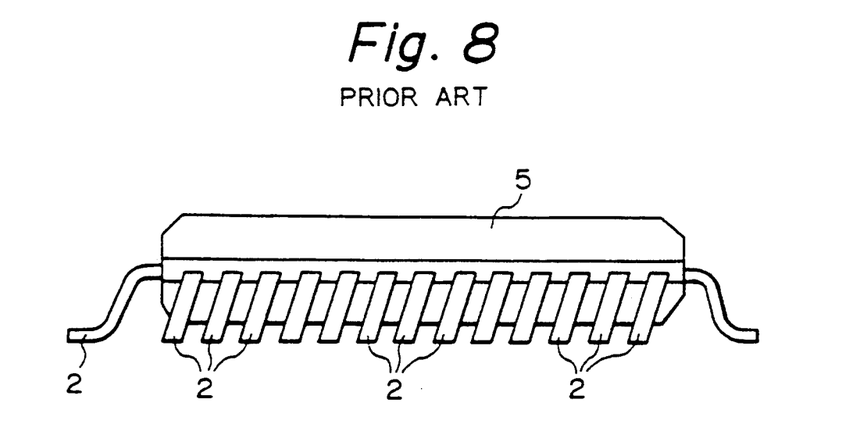
FIG. 8 is a side view of a semiconductor device having deformed leads.

The requirements to minimize the pitch of the leads are increasing limitlessly and, recently, the width of the leads has been narrowed to such a degree that the same corresponds to the thickness of the leads. FIGS. 7A to 7C of the attached drawings show cross-sections of typical leads for illustrating that the narrow lead tends to transversely coolapse. The lead 1 shown in FIG. 7A has a width greater than the thickness thereof, and the lead 2 shown in FIG. 7B has a width substantially equal to the thickness thereof. As will be apparent, if the width of the lead is narrowed, an unstable deformation occurs in the lead. For example, the lead 1 having a large width will not tend to deform if a transverse force F is applied to the lead 1, but the lead 2 having a small width will tend to deform widthwise (transversely) if a transverse force F is applied to the lead 2; the lead 2 of FIG. 7B thus may be deformed into the shape of the lead 3 shown in FIG. 7C. Therefore, in the step of bending the leads 2 after the step of forming a semiconductor package 5, the leads 2 shift widthwise (transversely) from their predetermined bent positions, as shown in FIG. 8, and it is difficult for such a semiconductor device to be accurately mounted on a circuit board.

SUMMARY OF THE INVENTION

The object of the present invention is to provide a lead frame in which undesirable deformation of the leads is prevented.

Another object of the present invention is to provide a semiconductor device which can be made using a lead frame in which undesirable deformation of the leads is prevented.

Yet another object of the present invention is to provide a lead bending die for bending leads of a lead frame for manufacturing a semiconductor device.

Still another object of the present invention is to provide a method of manufacturing a semiconductor device in which undesirable deformation of the leads is prevented.

According to one aspect of the present invention, there is provided a lead frame comprising at least one set of substantially parallel leads having inner ends for connection to a semiconductor chip and respective outer ends, an outer tiebar interconnecting the outer ends of the leads, and at least one guide hole provided in the outer tiebar, whereby the leads can be subjected to a bending operation which the guide hole remains in sliding engagement with a locating pin and the outer tiebar can be separated from the leads after the bending. Preferably, the guide hole has an elongated shape parallel to the leads.

With this arrangement, the leads are interconnected by the outer tiebar and the guide hole is provided in the outer tiebar. When bending the leads, the leads with the outer tiebar can be inserted in, for example, a bending die which has a locating pin and the leads are subjected to a bending operation while the guide hole remains in sliding engagement with the locating pin. The engagement of the guide hole with the locating pin prevents the outer tiebar, and thus the leads, from shifting widthwise (i.e., transversely). Accordingly, the leads can be bent with minimal undesirable deformation.

Preferably, the outer tiebar includes an outer bulge, or extension, at a central portion thereof and the guide hole is provided in the outer bulge.

Preferably, the lead frame is designed such that the semiconductor chip is sealed in a package having at least one side, each set of the leads protrudes from a corresponding side of the package and the associated outer tiebar extends parallel to the corresponding side of the package. It is also possible that the lead frame comprises two or four sets, each set of substantially parallel leads, with the respective two sets of the leads on opposite sides of the package extending in opposite directions from the package.

A semiconductor device as an intermediate product, obtained by using the above-described lead frame, comprises a semiconductor chip, a lead frame including at least one set of substantially parallel leads having inner ends for connection to the semiconductor chip and respective outer ends, an outer tiebar interconnecting the outer ends of the leads, and at least one guide hole provided in the outer tiebar, and a package having the semiconductor chip sealed therein and at least one side, each set of leads protruding from the corresponding side of the package and interconnected by the outer tiebar.

This semiconductor device can be delivered to a bending process for bending the leads of the lead frame.

The present invention provides a bending die adapted for bending the above-described lead frame, comprising at least one set of substantially parallel leads and an outer tiebar interconnecting the outer ends of the leads, and at least one guide hole provided in the outer tiebar. The bending die comprises a die member having a curved surface and at least one locating pin provided on the curved surface, and a press means for pressing the lead frame between the die member and the press means, whereby the leads can be subjected to a bending operation while maintaining sliding engagement of the guide hole with the locating pin.

Preferably, the die member comprises a central cavity for accommodating the package therein and a periphery, curved surfaces extending in opposite directions from a margin, or border, of the central cavity to corresponding portions of the periphery of the die member, and locating pins on the respective curved surfaces in correspondence with the sets of leads for engagement with the respective guide holes of the lead frame.

The present invention provides a method of manufacturing a semiconductor device, comprising the steps of: preparing a lead frame comprising at least one set of substantially parallel leads having inner ends and respective outer ends, an outer tiebar interconnecting the outer ends of the leads, and at least one guide hole provided in the outer tiebar; connecting the inner ends of the leads to a semiconductor chip; forming a package having at least one side by sealing the semiconductor chip in the package such that the set of leads protrudes from the one side of the package; engaging the guide hole in the outer tiebar with a locating pin provided in a bending die; bending the leads in the bending die; and separating the outer tiebar from the leads after the bending.

According to another aspect of the present invention, there is provided a lead frame comprising at least one set of substantially parallel leads having inner ends for connection to a semiconductor chip and respective outer ends, and dummy leads arranged on the outside of the outermost leads and connected to the outermost leads, the dummy leads having a width greater than that of the leads, whereby the leads can be subjected to a bending operation together with the dummy leads and the dummy leads can be separated from the outermost leads after the bending.

Preferably, the dummy leads are arranged parallel to the leads. With this arrangement, by bending the leads simultaneously with the dummy leads, the dummy leads receive a transverse force which may act to cause the leads to be deformed widthwise (i.e., transversely) and such a transverse force acting on the leads is mitigated by the dummy leads. Therefore, the leads can be bent in a predetermined form without undesirable deformation.

A semiconductor device as an intermediate produce can be obtained by using the above-described lead frame, comprising a semiconductor chip, a lead frame including at least one set of substantially parallel leads having inner ends connected to the semiconductor chip, and dummy leads arranged on the outside of the outermost leads and connected to the outermost leads, with the dummy leads separated from and thus not connected to the semiconductor chip, and a package having the semiconductor chip sealed therein and at least one side, the set of leads protruding from the one side of the package.

The present invention provides a method of manufacturing a semiconductor device, comprising the steps of: preparing a lead frame comprising at least one set of substantially parallel leads having inner ends and respective outer ends, and dummy leads arranged on the outside of the outermost leads and having a width greater than that of the leads, a dam bar interconnecting intermediate portions of the leads, and an outer frame interconnecting the outer ends of the leads, the dummy leads being arranged between and connected to the dam bar and the outer frame; connecting the inner ends of the leads to a semiconductor chip; forming a package having at least one side by sealing the semiconductor chip in the package such that each set of leads protrudes from the corresponding one side of the package; separating portions of the dam bar between the adjacent leads, bending simultaneously the leads and the dummy leads; and separating portions of the dam bar on the outside of the outermost leads and separating outer end portions of the leads for separating the dummy leads from the leads after the bending.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
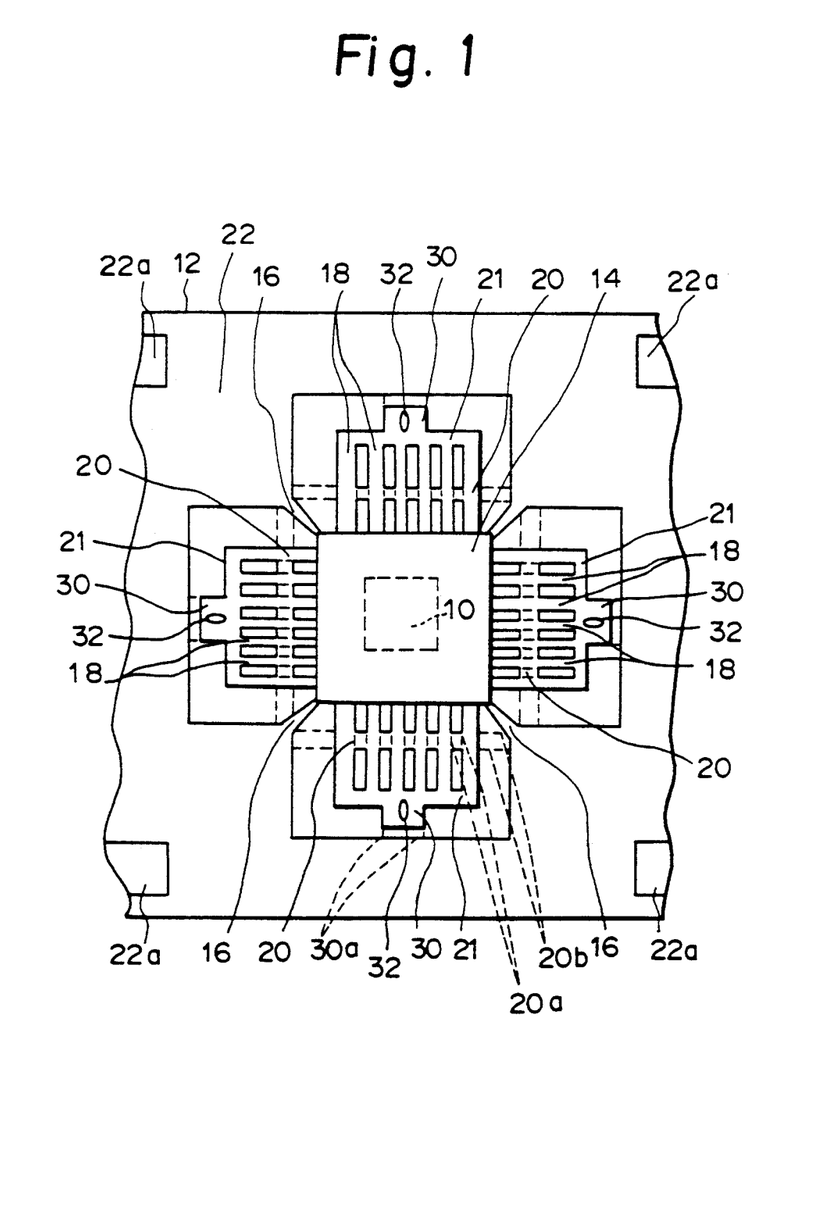
FIG. 1 is a plan view of a semiconductor device as an intermediate product according to the first embodiment of the present invention.

FIG. 1 shows a semiconductor device as an intermediate product according to the present invention, in which a semiconductor chip 10 is mounted on a lead frame 12 and sealed in a package 14 formed by a plastic molding or the like. The lead frame 12 includes an outer frame 22 with transportation holes 22a, suspension leads 16 extending diagonally from the package 14 for securing the semiconductor chip 10, and sets of substantially parallel leads 18. The suspension leads 16 are initially connected to the outer frame 22 and can be separated after the package 14 is completed.

This semiconductor device is of the type known as Quad Flat Package and has four sides, and each set of the substantially parallel leads 18 protrudes from each of the four sides of the package 14, with each of the two sets of leads on opposite edges of the package 14 extending therefrom in opposite directions. It will be understood that the present invention can be applied to semiconductor devices having other lead arrangements which protrude from one side or two sides of the package.

The leads 18 have inner ends and outer ends, respectively. The inner ends of the leads 18 are connected to the semiconductor chip 10 by a well known bonding technique. The lead frame 12 includes, for each set of the leads 18, a dam bar 20 extending parallel to the side of the package 14 for interconnecting the intermediate portions of the leads 18, and an outer tiebar 21 extending parallel to the side of the package 14 for interconnecting the outer ends of the leads 18. Portions 20a of the dam bar 20 between the adjacent leads 18 are separated after the package 14 is completed and before the leads 18 are subjected to bending. The dam bar 20 includes extensions 20b which are initially connected to the outer frame 22 and separated from the outer frame 22 after the package 14 is completed and before the leads 18 are subjected to bending.

Each outer tiebar 21 includes another bulge (i.e., extension or protrusion) 30 at a central region (i.e., portion) thereof. The outer bulge 30 is initially connected to the outer frame 22 by portions 30a, and is separated from the outer frame 22 by severing the portions 30a after the package 14 is completed and before the leads 18 are subjected to bending.

A guide hole 32 is provided in each of the outer tiebars 21. Each guide hole 32 has an elongated shape, the longer dimension being parallel to the leads 18 and thus perpendicular to the outer tiebars 21, and extends into the outer bulge 30.

Figure 2:
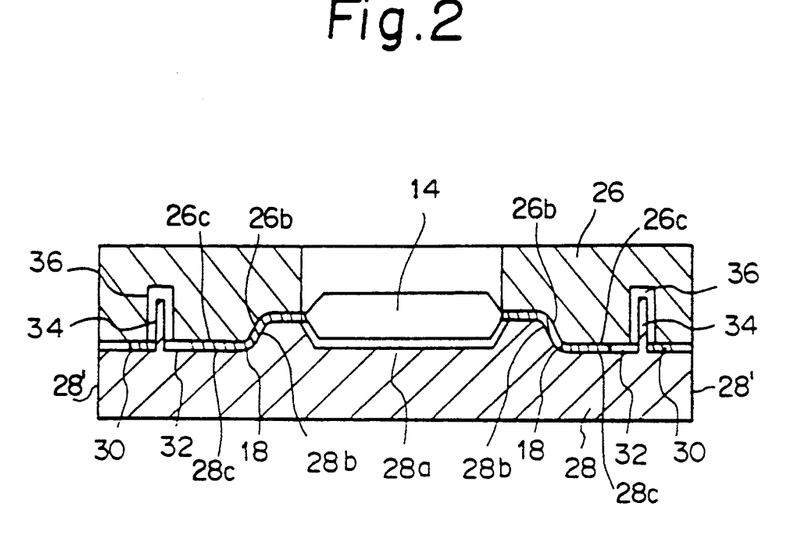
FIG. 2 is a cross-sectional view of a bending die adapted to bend the leads of FIG. 1.
Figure 3:
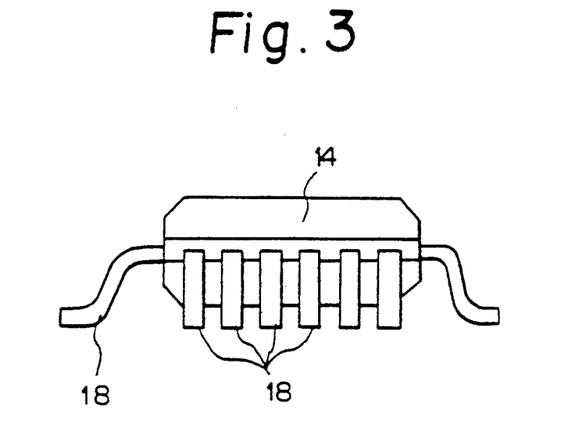
FIG. 3 is a side view of the semiconductor device of FIG. 1, when the leads are bent.

FIG. 2 is a cross-sectional view of a bending die adapted to bend the leads 18 of the semiconductor device of FIG. 1. The bending die comprises a main lower die member 28 and a pressing upper die member 26. The lower die member 28 has a central cavity 28a on the upper side thereof for accommodating the package 14 therein and an outer periphery 28', and respective curved surfaces 28b extending from the border, or edges, of the central cavity 28a to planar edge surfaces 28c in turn extending to the periphery 28' of the die member. Each of the curved surfaces 28b corresponds to a final shape of the bent leads 18.

A locating pin 34 is provided on each of the planar surfaces 28c at a position near the periphery of the lower die member 28. The locating pin 34 has a height exceeding a major top plane of the package 14, or at least a common top plane of the unbent leads 18, when the semiconductor device of FIG. 1 is inserted in the lower die member 28. Accordingly, each guide hole 32 engages a corresponding locating pin 34 and permits sliding engagement therewith, as the leads 18 are effectively retracted in lateral extent during the bending operation. Thus, the locating pin 34 initially engages the (inner) end portion of the guide hole 32 disposed toward the chip 10, prior to bending of the leads 18, and then, after bending of the leads 18, engages the opposite (outer) end portion of the guide hole 32 disposed toward the outer tiebar 21. In this regard, the guide hole 32 has an elongated shape parallel to the leads 18 to permit a predetermined bending of the leads 18 and prohibit undesirable transverse deformation of the leads 18.

The upper die member 26 has complementary curved and planar surfaces 26b and 26c matching, or mating, the curved and planar surfaces 28b and 28c, respectively, of the lower die member 28 so that the die member 26 can press all the leads 18 at a time thereby to bend the leads 18. The upper die member 26 has an area substantially equal to that of the lower die member 28 and has recesses 36 for accommodating the respective locating pins 34. However, the upper die member 26 can be modified to other forms when it is only necessary to press or urge the leads 18 against the lower die member 28. It may be possible to use rollers to press or urge the leads 18 to the lower die member 28.

As will be apparent, the semiconductor device can be manufactured depending on the following steps. The lead frame 12 of FIG. 1 is prepared and the inner ends of the leads 18 are connected to the semiconductor chip 10. Then the package 14 is formed in which each set of the leads 18 protrudes from a corresponding side of the package 14. Then portions 20a and 20b of each dam bar 20 and the portion 30a of each bulge 30 of the outer tiebar are separated from the outer frame 22. Then the semiconductor device is inserted in the bending die and each guide hole 32 is engaged with the corresponding locating pin 34. Then the leads 18 are bent in the bending die by pressing the upper die member 26 against the lower die member 28. After the leads 18 are bent, the outer tiebar 21 is separated from the leads 18, whereby the leads 18 are independent of each other.

Figure 4:
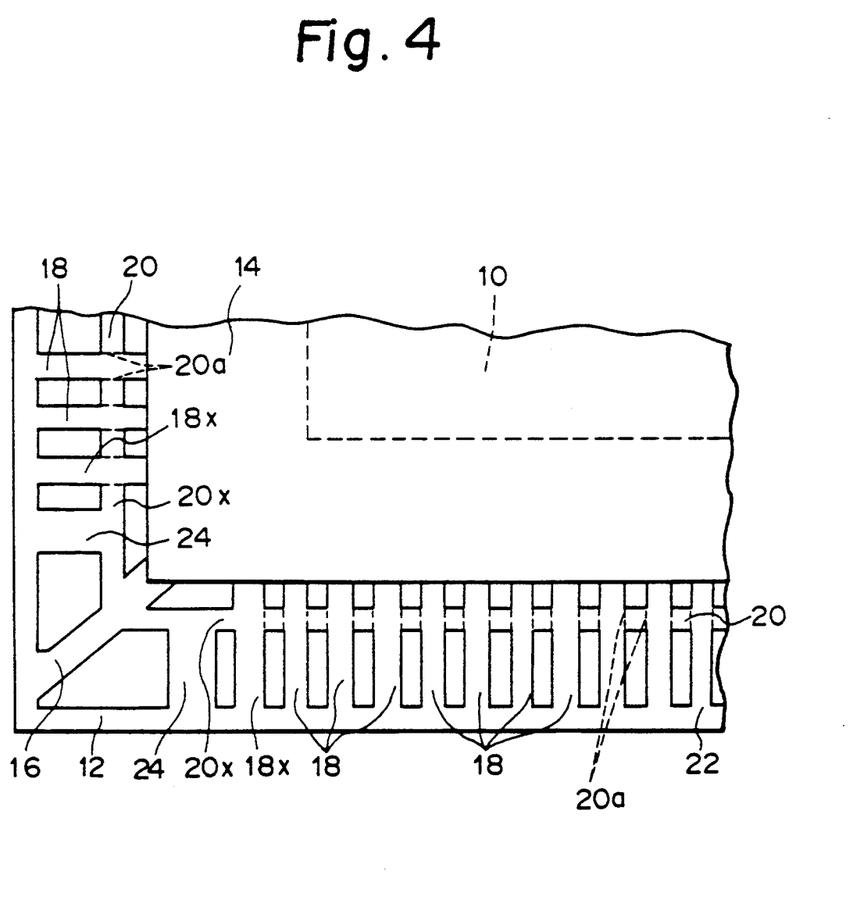
FIG. 4 is a plan view of a semiconductor device as an intermediate product according to the second embodiment of the present invention.

FIG. 4 shows the second embodiment of the present invention. The semiconductor device comprises a semiconductor chip 10 mounted on a lead frame 12 and sealed in a package 14 formed by plastic molding or the like. The lead frame 12 includes an outer frame 22, suspension leads 16 extending diagonally from the package 14 for securing the semiconductor chip 10, and sets of substantially parallel leads 18. The suspension leads 16 are initially connected to the outer frame 22 and can be separated after the package 14 is completed.

Only a portion of the semiconductor device is shown in FIG. 4, but it will be understood that the package 14 has a rectangular shape with opposite sides. A set of substantially parallel leads 18 is arranged for each side of the package 14. Outermost leads located at outermost positions, i.e., positions near the suspension leads 16, in each set of leads 18 are represented by 18x. The leads 18 and 18x have respective inner ends and outer ends. The inner ends of the leads 18 and 18x are connected to the semiconductor chip 10 by bonding.

The lead frame 12 includes dam bars 20 extending parallel to the side of the package 14 for interconnecting the intermediate portions of the leads 18 of the respective sets of leads 18, and portions of the outer frame 22 extending parallel to the side of the package 14 interconnecting the outer ends of the leads 18. The dam bars 20 are provided mainly for the purpose of preventing the molding plastic from flowing toward the outer end of the leads 18 and 18x upon forming the package 14 and thus located at positions slightly to the exterior side of the package 14. Portions 20a of the dam bar 20 between the adjacent leads 18 are separated after the package 14 is completed and before the leads 18 are subjected to a bending. The dam bar 20 includes extensions 29x initially connected to the outermost leads 18x and the outer frame 22; in this embodiment, the extensions 20x are not separated from the outermost leads 18x and the outer frame 22 until bending of the leads 18 and 18x is completed.

The lead frame 12 includes dummy leads 24 arranged parallel to the leads 18 and 18x on the outside of the outermost leads 18x and connected to the outermost leads 18x. The dummy leads 24 have a width greater than that of the leads 18 and 18x and thus have a strength greater than that of the leads 18 and 18x. The dummy leads 24 are arranged between the extension 20x of the dam bar 20 and the outer frame 22 and thus connected to the dam bar 20 and the outer frame 22. The dummy leads 24 are not connected to the semiconductor chip 10 and do not reach the package 14.

Figure 6:
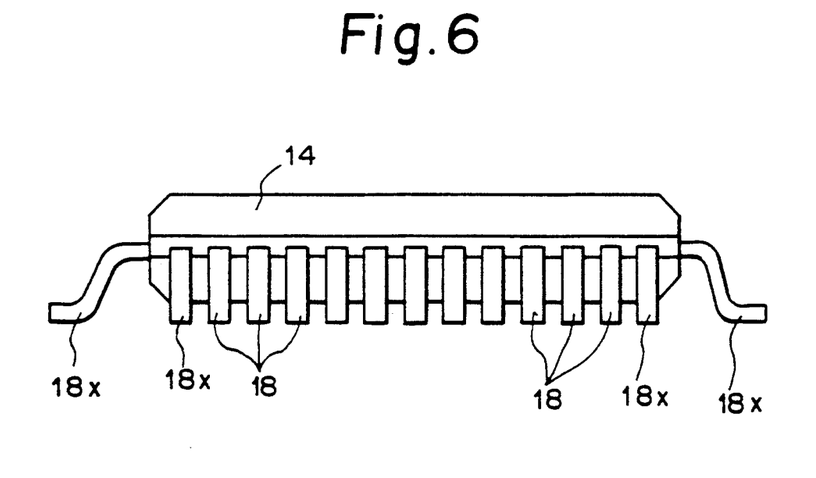
FIG. 6 is a side view of the semiconductor device of FIG. 5 when the leads are bent and the dummy leads are separated.

With this arrangement, the leads 18 and 18x are bent simultaneously with the dummy leads 24, and the dummy leads 24 receive a transverse force which may act to cause the leads 18 and 18x to undergo deformation widthwise, said transverse force acting on the leads 18 and 18x being mitigated by the dummy leads 24. Therefore, the leads 18 and 18x can be bent in a predetermined form without undesirable deformation. The dummy leads 24 can be separated from the outermost leads 18x, after bending thereof, by separating the extension 20x of the dam bar 20 and the outer frame 22, as shown in FIG. 6.

In the semiconductor device as an intermediate product, as shown in FIG. 4, the leads 18 and 18x are connected to the semiconductor chip 10 but the dummy leads 24 are separated from the semiconductor chip.

Figure 5:
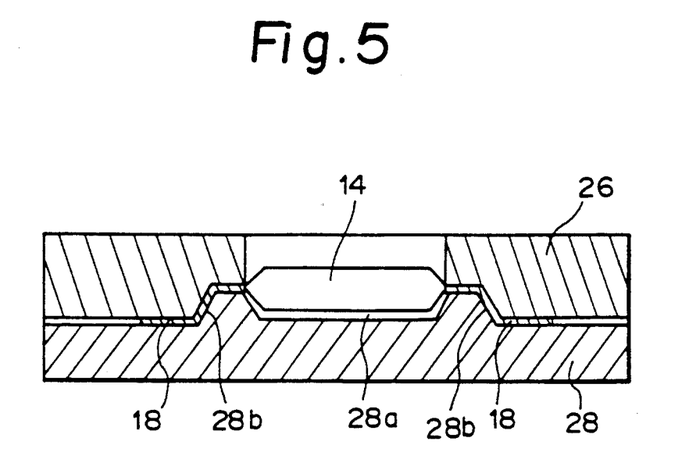
FIG. 5 is a cross-sectional view of a bending die adapted to bend the leads of FIG. 4.

FIG. 5 is a cross-sectional view of a bending die adapted to bend the leads 18 of the semiconductor device of FIG. 4. The bending die comprises a main lower die member 28 and a pressing upper die member 26. The lower die member 28 has a central cavity 28a on the upper side thereof for accommodating the package 14 therein and a periphery, and curved surfaces 28b extending from the margin of the central cavity 28a to corresponding planar surfaces 28c and the latter extending to the periphery of the die member 28. Each of the curved surfaces 28b correspond to a final shape of the bend leads 18. The upper die member 26 has a complementary curved surface with the curved surface of the lower die member 28 so that the upper die member 26 can press all the leads 18 at a time to bend the leads 18 and 18x.

As will be apparent, the semiconductor device can be manufactured in accordance with the following steps. The lead frame 12 of FIG. 4 is prepared and the inner ends of the leads 18 and 18x are connected to the semiconductor chip 10. Then the package 14 is formed in which the set of the leads 18 and 18x protrude from one side of the package 14. Then portions 20a of the dam bar 20 between the adjacent leads 18 and 18x and the suspension leads 16 are separated from the outer frame 22. Then the leads 18 and 18x and the dummy leads 24 are bent simultaneously in the bending die. After the bending of the leads 18 and 18x and the dummy leads 24, portions 20x of the dam bar 20 on the outside of the outermost leads 18x and outer end portions of the leads 18 and 18x are separated, thereby for separating the dummy leads 24 from the leads 18 and 18x and whereby the leads 18 and 18x are independent of each other.

As explained above, according to the present invention, it is possible to prevent undesirable deformation of the leads when the leads are bent and thus to obtain a semiconductor device of high packaging density.

We claim:

1. A lead frame comprising:
   at least one set of substantially parallel leads, the leads respectively having inner ends for connection to a semiconductor chip, outer ends for external connection, and central portions therebetween;
   each set of substantially parallel leads having a corresponding outer tiebar interconnecting the respective outer ends of the leads; and
   each outer tiebar having at least one guide hole therein, of an elongated configuration and with the longer dimension thereof parallel to the leads, for engaging a locating pin during bending of the leads from a substantially planar initial configuration to a final configuration in which the respective leads of each set are bent in the corresponding central portions thereof thereby to dispose the respective outer ends of the leads of each set in a second plane, different from the first plane, the corresponding outer tiebar maintaining the interconnection of the outer ends of the leads of the at least one set in the initial configuration and during bending thereof into the final configuration and being severable therefrom after bending into the final configuration.

2. A lead frame as recited in claim 1, wherein the leads of each set are of a common first length, defining a corresponding first lateral extent thereof in the substantially planar initial configuration thereof and, in the final configuration thereof, are of a second lateral extent, different from and less than the first lateral extent, the longer dimension of each elongated guide hole being defined by the difference between the first and second lateral extends of the leads.

3. A lead frame as recited in claim 1 wherein, when the semiconductor chip is sealed in a package having at least one side, the at least one set of leads is respectively associated with and protrudes from the at least one side of the package with the leads extending in substantially perpendicular relationship relatively to, and with the corresponding outer tiebar extending in substantially parallel relationship relatively to, the respectively associated at least one side of the package.

4. A lead frame as recited in claim 1, wherein, for each set of substantially parallel leads, the corresponding outer tiebar includes an extension which projects outwardly therefrom relatively to the leads interconnected thereby, the guide hole being located at least in part in the extension.

5. A lead frame as recited in claim 1, further comprising:
   an outer frame disposed in surrounding relationship relatively to and outwardly of the corresponding outer tiebar of each set of substantially parallel leads, in the substantially planar initial configuration thereof; and
   for each set of substantially parallel leads, the corresponding outer tiebar includes an extension which projects outwardly therefrom, relatively to the leads interconnected thereby, and interconnects the outer tiebar with an adjacent portion of the outer frame in the substantially planar initial configuration of the leads, the extension being separated from the outer frame in the final configuration of the leads.

6. A lead frame as recited in claim 1 wherein, when the semiconductor chip is sealed in a package having first and second, substantially parallel sides, the lead frame comprises two sets of substantially parallel leads respectively associated with the two sides of the package and having corresponding first and second outer tiebars, the first and second sets of parallel leads protruding from the respective first and second sides of the package in substantially perpendicular relationship thereto and the respective first and second outer tiebars extending in parallel relationship relatively to the respectively associated first and second sides of the package, each of the first and second outer tiebars having at least one guide hole therein.

7. A lead frame as recited in claim 1 wherein, when the semiconductor chip is sealed in a package having four sides with the first and second sides in substantially parallel relationship and the third and fourth sides in substantially parallel relationship and perpendicular to the first and second sides, the lead frame comprises four sets of substantially parallel leads respectively associated with the four sides of the package and having respective first, second, third and fourth outer tiebars, each of the first, second, third and fourth sets of parallel leads protruding from the respective first, second, third and fourth sides of the package in substantially perpendicular relationship thereto and the respective first, second, third and fourth outer tiebars extending parallel to the respectively associated first, second, third and fourth sides of the package, each of the first, second, third and fourth outer tiebars having at least one guide hole therein.

8. A lead frame as recited in claim 1, further comprising a dam bar extending transversely to and interconnecting the parallel leads, at corresponding positions thereon intermediate the respective inner and outer ends thereof.

9. A lead frame as recited in claim 1, further comprising:
- an outer frame disposed in surrounding relationship relatively to and outwardly of the corresponding outer tiebar of each set of substantially parallel leads, in the substantially planar initial configuration thereof; and
- the dam bar further includes first and second opposite ends having first and second opposite extensions connecting the respective first and second outer ends of dam bar to the corresponding, adjacent portions of the outer frame in the initial configuration, the extensions being severable from the outer frame in the final configuration.

10. A lead frame as recited in claim 1 wherein, when the semiconductor chip is sealed in a package having at least one side, the at least one set of leads is respectively associated with and protrudes from the at least one side of the package with the leads extending in substantially perpendicular relationship relatively to, and with the outer tiebar extending in substantially parallel relationship relatively to, the respectively associated at least one side of the package, and the lead frame further comprises suspension leads for securing the semiconductor chip thereto.

11. A semiconductor device comprising:
- a semiconductor chip;
- a lead frame comprising:
  - at least one set of substantially parallel leads, the leads respectively having inner ends for connection to a semiconductor chip, outer ends for external connection, and central portions therebetween,
  - each set of substantially parallel leads having a corresponding outer tiebar interconnecting the respective outer ends of the leads, and
  - each outer tiebar having at least one guide hole therein, of an elongated configuration and with the longer dimension thereof parallel to the leads, for engaging a locating pin during bending of the leads from a substantially planar initial configuration to a final configuration in which the respective leads of each set are bent in the corresponding central portions thereof thereby to dispose the respective outer ends of the leads of each set in a second plane, different from the first plane, the corresponding outer tiebar maintaining the interconnection of the outer ends of the leads of the at least one set in the initial configuration thereof and during bending thereof and being severable therefrom after bending thereof into the final configuration thereof; and
- a package sealing the semiconductor chip therewithin and having at least one side, the at least one set of leads being respectively associated with and protruding from the at least one side of the package with the leads extending in substantially perpendicular relationship relatively to, and with the outer tiebar extending in substantially parallel relationship relatively to, the respectively associated at least one side of the package.

12. A semiconductor device as recited in claim 11, wherein the lead frame further comprises:
- an outer frame disposed in surrounding relationship relatively to, and outwardly of, the corresponding outer tiebar of each set of substantially parallel leads, in the substantially planar initial configuration thereof, and the corresponding outer tiebar being connected to the outer frame in the initial configuration of the leads and being severed from the outer frame in the final configuration of the leads.

13. A lead frame comprising;
- at least one set of substantially parallel connector and dummy leads each set including first and second outermost connector leads, a plurality of further connector leads disposed at intermediate positions between the first and second outermost connector leads and first and second dummy leads respectively disposed in spaced relationship, outwardly of and adjacent to the first and second outermost connector leads, the connector leads respectively having inner ends for connection to a semiconductor chip, outer ends for external connection and central portions extending therebetween and the dummy leads having first and second portions respectively corresponding to the central portions and the outer ends of the connector leads;
- each set of substantially parallel connector leads and dummy leads having a corresponding outer tiebar interconnecting the respective outer ends of the corresponding connector leads and the second portions of the corresponding first and second dummy leads; and
- each outer tiebar having at least one guide hole therein, of an elongated configuration and with the longer dimension thereof parallel to the connector leads, for engaging a locating pin during bending of the connector leads from a substantially planar initial configuration to a final configuration in which the corresponding connector leads of each set are bent in the respective central portions thereof thereby to dispose the respective outer ends of the corresponding connector leads of each set in a second plane, different from the first plane, the corresponding outer tiebar maintaining the interconnection of the outer ends of the corresponding connector and dummy leads of the at least one set in the initial configuration thereof and during bending thereof and being severable therefrom after bending thereof into the final configuration thereof.

14. A lead frame as recited in claim 13, wherein each dummy lead has a width which is greater than the width of the connector leads.

15. A lead frame as recited in claim 14, further comprising a dam bar extending transversely to and interconnecting the corresponding connector leads, at a position thereon intermediate the inner and outer ends thereof.

16. A semiconductor device comprising:
a semiconductor chip;
a lead frame comprising:
at least one set of substantially parallel connector leads including first and second, outer most connector leads and a plurality of further connector leads disposed at intermediate positions between the first and second outer most connector leads and first and second dummy leads respectively disposed in spaced relationship, outwardly of an adjacent to and in substantially parallel relationship with the first and second outermost connector leads, the connector leads respectively having inner ends for connection to a semiconductor chip, outer ends for external connection, and central portions therebetween and the dummy leads having a first and second portions respectively corresponding to the central portions and the outer ends of the connector leads,
each set of substantially parallel connector and dummy leads having a corresponding outer tiebar interconnecting the respective outer ends of the corresponding connector and dummy leads,
each outer tiebar having at least one guide hole therein, of an elongated configuration and with the longer dimension thereof parallel to the connector leads, for engaging a locating pin during bending of the connector leads from a substantially planar initial configuration to a final configuration in which the corresponding connector leads of each set are bent in the respective central portions thereof thereby to dispose the respective outer ends of the corresponding connector leads of each set in a second plane, different from the first plane, the corresponding outer tiebar maintaining the interconnection of the outer ends of the corresponding connector leads of the at least one set in the initial configuration and during bending thereof into the final configuration and being severable therefrom after bending into the final configuration; and
a package sealing the semiconductor chip therewithin and having at least one side, the at least one set of corresponding connector and dummy leads being respectively associated with, and protruding from, the at least one side of the package with the leads extending in substantially perpendicular relationship relatively to, and with the outer tiebar extending in substantially parallel relationship relatively to, the respectively associated at least one side of the package.

* * * * *

UNITED STATES PATENT AND TRADEMARK OFFICE
CERTIFICATE OF CORRECTION

PATENT NO. : 5,293,064
DATED : March 8, 1994
INVENTOR(S) : Masanori YOSHIMOTO et al.

It is certified that error appears in the above-indentified patent and that said Letters Patent is hereby corrected as shown below:

On the Cover Page, [57] In the Abstract, line 11, "them" should be --the--.

Col. 1, line 50, change "coolapse" to --collapse--.

Col. 6, line 56, change "29x" to --20x--.

Col. 9, line 24, change "1" to --8--.

Signed and Sealed this

Fourth Day of October, 1994

Attest:

BRUCE LEHMAN

Attesting Officer

Commissioner of Patents and Trademarks